(12) United States Patent
Shiraishi

(10) Patent No.: US 11,031,313 B2
(45) Date of Patent: Jun. 8, 2021

(54) SEMICONDUCTOR DEVICE

(71) Applicant: Mitsubishi Electric Corporation, Tokyo (JP)

(72) Inventor: Takuya Shiraishi, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/732,584

(22) Filed: Jan. 2, 2020

(65) Prior Publication Data
US 2020/0411404 A1 Dec. 31, 2020

(30) Foreign Application Priority Data
Jun. 27, 2019 (JP) .............................. JP2019-120457

(51) Int. Cl.
*H01L 23/367* (2006.01)
*H01L 23/40* (2006.01)
*H01L 23/00* (2006.01)

(52) U.S. Cl.
CPC ...... *H01L 23/3672* (2013.01); *H01L 23/4006* (2013.01); *H01L 24/45* (2013.01); *H01L 2023/4087* (2013.01)

(58) Field of Classification Search
CPC . H01L 23/3672; H01L 23/4006; H01L 24/45; H01L 2023/4087
See application file for complete search history.

(56) References Cited

U.S. PATENT DOCUMENTS

| | | | | |
|---|---|---|---|---|
| 2005/0093123 | A1* | 5/2005 | Yoshida | H01L 24/49 257/678 |
| 2010/0244237 | A1* | 9/2010 | Shiraishi | H01L 23/367 257/718 |
| 2018/0182719 | A1* | 6/2018 | Muto | H01L 23/49562 |
| 2019/0157177 | A1* | 5/2019 | Ichimura | H01L 24/46 |

FOREIGN PATENT DOCUMENTS

JP S62014737 U 1/1987

* cited by examiner

*Primary Examiner* — Peniel M Gumedzoe
(74) *Attorney, Agent, or Firm* — Studebaker & Brackett PC

(57) ABSTRACT

A semiconductor device includes: a semiconductor module including a module main body having first and second main surfaces which are opposite to each other, and a terminal protruding from a side surface of the module main body and bent toward the first main surface; a mounting board placed on the first main surface side and connected to the terminal; a heat radiation fin placed on the second main surface side; and a screw fitting a fitting portion of the module main body from the first main surface side to the heat radiation fin, wherein the mounting board is provided with an opening at a portion facing the fitting portion, and a type of a product is printed on the first main surface and exposed from the opening of the mounting board.

20 Claims, 10 Drawing Sheets

SEMICONDUCTOR DEVICE

BACKGROUND OF THE INVENTION

Field

The present invention relates to a semiconductor device.

Background

With respect to a semiconductor module having a transfer mold structure, a mold name is printed on a mold surface (for example, see JP S62-014737 U). With respect to a power module, in order to improve the heat radiation of a power chip, a heat radiation fin having a size larger than a module size is mounted on a surface opposite to a mold surface which has been subjected to terminal bending. Therefore, a product model name is printed on the mold surface which has been subjected to terminal bending.

SUMMARY

Since a mounting board is mounted on the mold surface which has been subjected to terminal bending, it is necessary to remove the mounting board in order to confirm the model name after the mounting board has been mounted. A dedicated opening may be provided in the mounting board so that the product model name is visually recognized, but this increases the processing cost. Furthermore, since a place at which the product model name is printed varies according to each module, it is necessary to perform design of an opening for each module, which has caused a problem that the production efficiency deteriorates. Furthermore, since it is impossible to provide a wiring pattern in the opening, there has also been a problem that the degree of freedom in design deteriorates.

The present invention has been made to solve the above-described problems, and has an object to provide a semiconductor device capable of identifying a product without deteriorating production efficiency and degree of freedom in design.

A semiconductor device according to the present invention includes: a semiconductor module including a module main body having first and second main surfaces which are opposite to each other, and a terminal protruding from a side surface of the module main body and bent toward the first main surface; a mounting board placed on the first main surface side and connected to the terminal; a heat radiation fin placed on the second main surface side; and a screw fitting a fitting portion of the module main body from the first main surface side to the heat radiation fin, wherein the mounting board is provided with an opening at a portion facing the fitting portion, and a type of a product is printed on the first main surface and exposed from the opening of the mounting board.

In the present invention, the type of the product is exposed from the opening of the mounting board. Therefore, the type can be visually recognized without removing the mounting board. Furthermore, since the opening is originally provided to screw the semiconductor module to the heat radiation fin, it is not necessary to provide the mounting board with a dedicated opening only for visually recognizing the product model name. Therefore, the product can be identified without deteriorating the production efficiency and the degree of freedom in design.

Other and further objects, features and advantages of the invention will appear more fully from the following description.

DESCRIPTION OF EMBODIMENTS

A semiconductor device according to the embodiments of the present invention will be described with reference to the drawings. The same components will be denoted by the same symbols, and the repeated description thereof may be omitted.

First Embodiment

Figure 1:
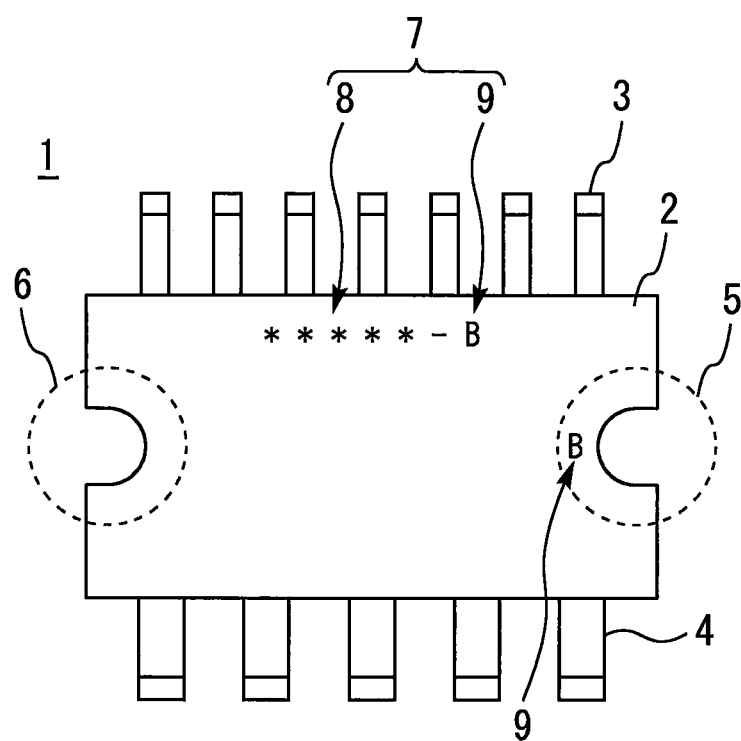
FIG. 1 is a top view illustrating a semiconductor module according to a first embodiment.

FIG. 1 is a top view illustrating a semiconductor module according to a first embodiment. The semiconductor module 1 has a transfer mold structure including a module main body 2, and terminals 3 and 4 protruding from side surfaces of the module main body 2 which are opposite to each other. The module main body 2 has first and second main surfaces which are opposite to each other. The first main surface is on this side of the drawing. The terminals 3 and 4 are bent toward the first main surface. Fitting portions 5 and 6 are provided at both ends in a longitudinal direction of the module main body 2 from which the terminals 3 and 4 do not project. The fitting portions 5 and 6 are provided with arc-shaped notches which allow screws to pass therethrough. A circular hole through which a screw passes may be provided instead of the notch.

A product model name 7 is printed on the first main surface of the module main body 2. The product model name 7 consists of a series name 8 and a type 9. The type 9 is indicated by characters, letters, or symbols, and represents information that cannot be identified from the outer shape of the semiconductor module 1, for example, a rated current value. Here, the series name is "*****", and the type is "B". "B" which is the type 9 is also printed in the vicinity of the notch of the fitting portion 5.

Figure 2:
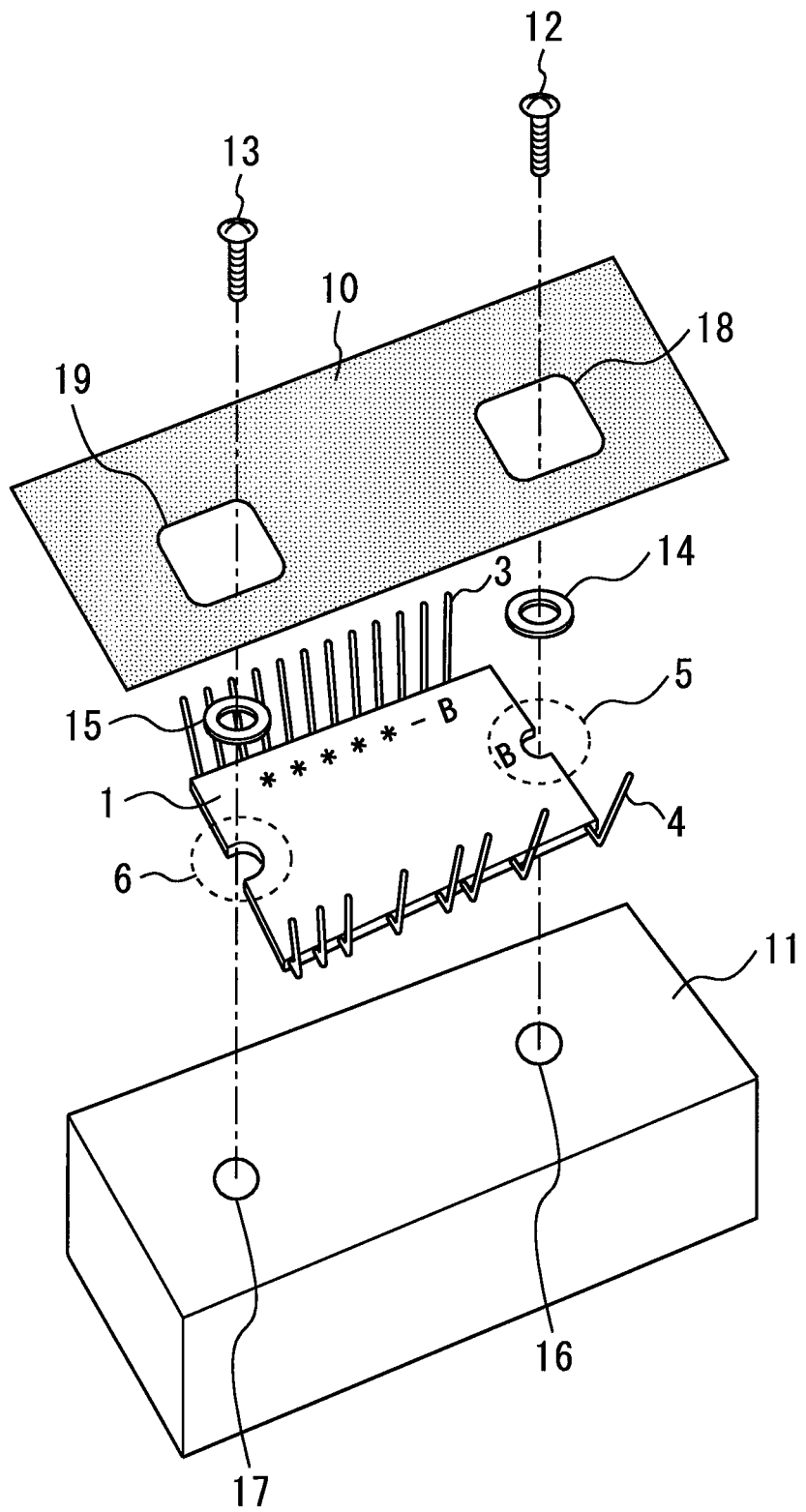
FIG. 2 is a perspective view illustrating an aspect of fabrication of the semiconductor device according to the first embodiment.

FIG. 2 is a perspective view illustrating an aspect of fabrication of the semiconductor device according to the first embodiment. A mounting board 10 is placed on the first main surface side of the module main body 2, and connected to the terminals 3 and 4. A heat radiation fin 11 is placed on the second main surface side of the module main body 2. Screws 12 and 13 fit the fitting portions 5 and 6 of the module main body 2 from the first main surface side to the heat radiation fin 11. The screws 12 and 13 are passed through the notches of the fitting portions 5 and 6 of the semiconductor module 1 via washers 14 and 15, and inserted into screw holes 16 and 17 of the radiation fin 11. The mounting board 10 is provided with openings 18 and 19 at portions facing the fitting portions 5 and 6. The screws 12 and 13 can be tightened at the openings 18 and 19 by a screwdriver or the like.

Figure 3:
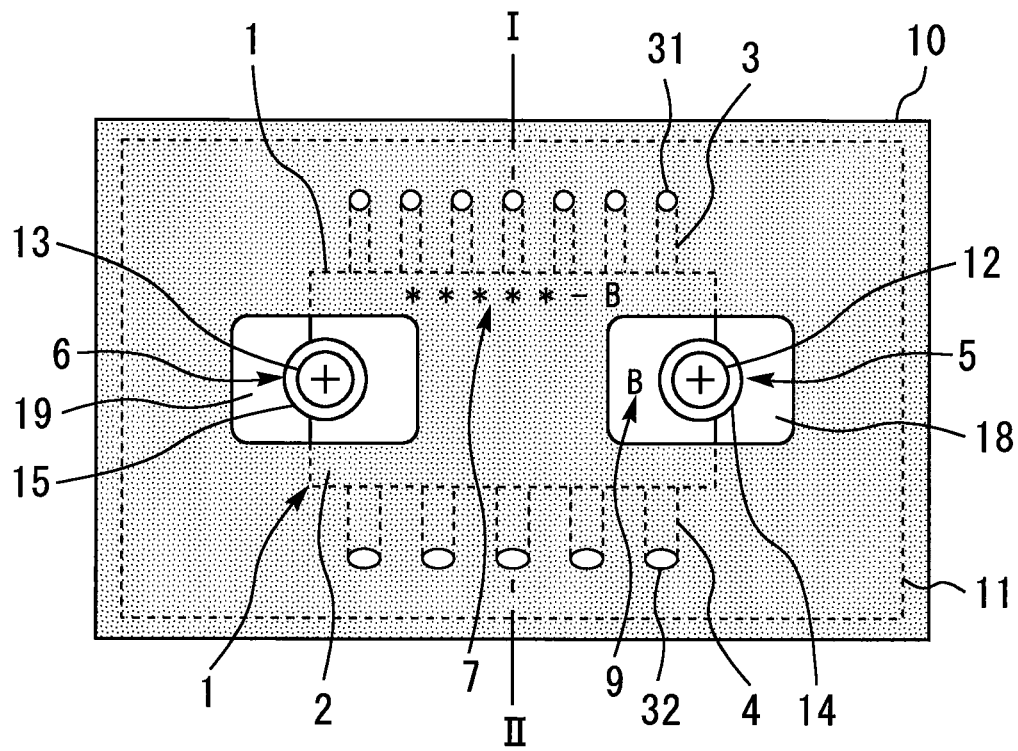
FIG. 3 is a top view illustrating the semiconductor device according to the first embodiment.
Figure 4:
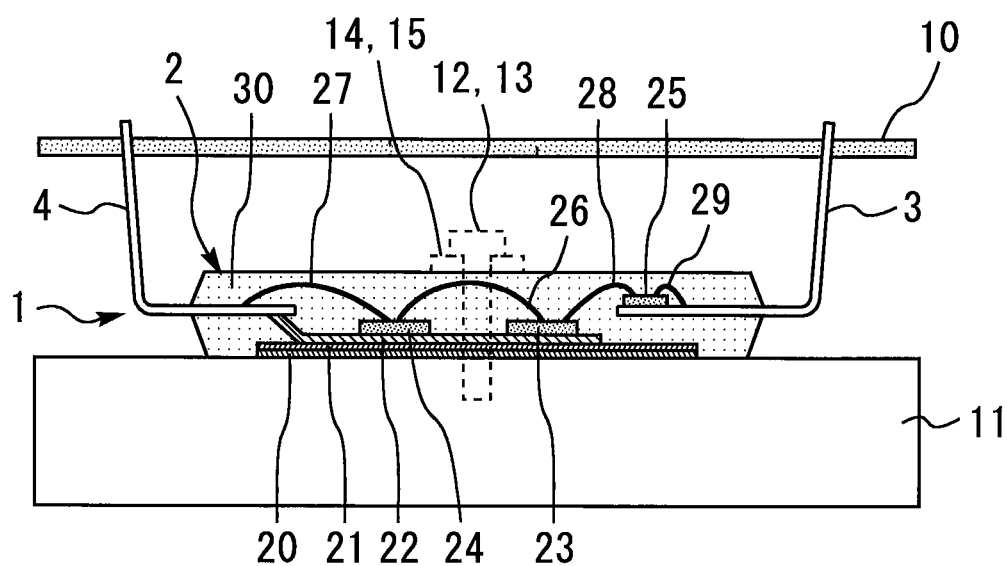
FIG. 4 is a cross-sectional view taken along a line I-II in FIG. 3.

FIG. 3 is a top view illustrating the semiconductor device according to the first embodiment. FIG. 4 is a cross-sectional view taken along a line I-II in FIG. 3. This semiconductor device is an inverter system including the semiconductor module 1, the mounting board 10, and the heat radiation fin 11.

A conductor 20, an insulating sheet 21, and a conductor 22 are laminated inside the semiconductor module 1. Semiconductor chips 23 and 24 are mounted on the conductor 22. A semiconductor chip 25 is mounted on the terminal 3. The semiconductor chip 23 is an IGBT, the semiconductor chip 24 is an FWD, and the semiconductor chip 25 is a drive IC. The semiconductor chips 23 and 24 are connected to each other by an Al wire 26. The semiconductor chip 24 is connected to the terminal 4 by an Al wire 27. The semiconductor chip 25 is connected to the semiconductor chip 23 by an Al wire 28, and connected to the terminal 3 by an Al wire 29. Parts of the terminals 3 and 4, the semiconductor chips 23 to 25, and the Al wires 26 to 29 are sealed with sealing resin 30, thereby configuring the module main body 2.

The mounting board 10 is placed on an upper surface side of the module main body 2 where the terminals 3 and 4 are bent. The tips of the terminals 3 and 4 are inserted into through holes 31 and 32 of the mounting board 10 and connected to wirings of the mounting board 10 by soldering or the like. The heat radiation fin 11 is in contact with a lower surface of the module main body 2 and radiates heat generated in the semiconductor chips 23 and 24.

When products having the series name "*****" have the same outer shape, but have a plurality of types, the products cannot be identified unless the printed type 9 is visually recognized. On the other hand, in the present embodiment, the type 9 of a product is exposed from the opening 18 of the mounting board 10. Therefore, the type 9 can be visually recognized without removing the mounting board 10. Furthermore, since the opening 18 is originally provided to screw the semiconductor module 1 to the heat radiation fin 11, it is not necessary to provide the mounting board 10 with a dedicated opening only for visually recognizing the product model name 7. Therefore, the product can be identified without deteriorating the production efficiency and the degree of freedom in design.

In order to avoid stress from concentrating on the semiconductor module 1 due to screw tightening, the screws 12 and 13 fit the semiconductor module 1 via the washers 14 and 15. When screws 12 and 13 of M3 size are used, the diameters of the washers 14 and 15 are equal to 7 mm as standard. The type 9 is printed outside the washers 14 and 15. As a result, the type 9 can be visually recognized without removing the screws 12 and 13 and the washers 14 and 15. Note that screwing may be performed without use of the washers 14 and 15.

Second Embodiment

Figure 5:
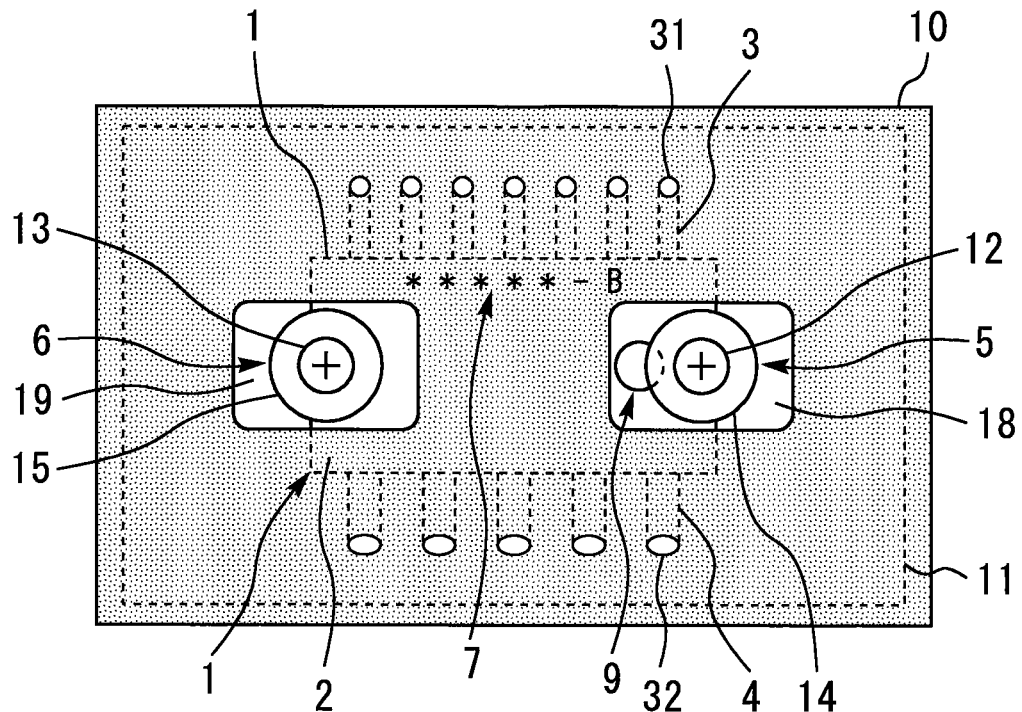
FIG. 5 is a top view illustrating a semiconductor device according to a second embodiment.

FIG. 5 is a top view illustrating a semiconductor device according to a second embodiment. A circle is printed as the type 9. Such a symbol is more easily analogized than a character even when only a part of the symbol is visually recognizable. Accordingly, a product can be identified when at least a part of the type 9 is printed outside the washers 14 and 15.

Third Embodiment

Figure 6:
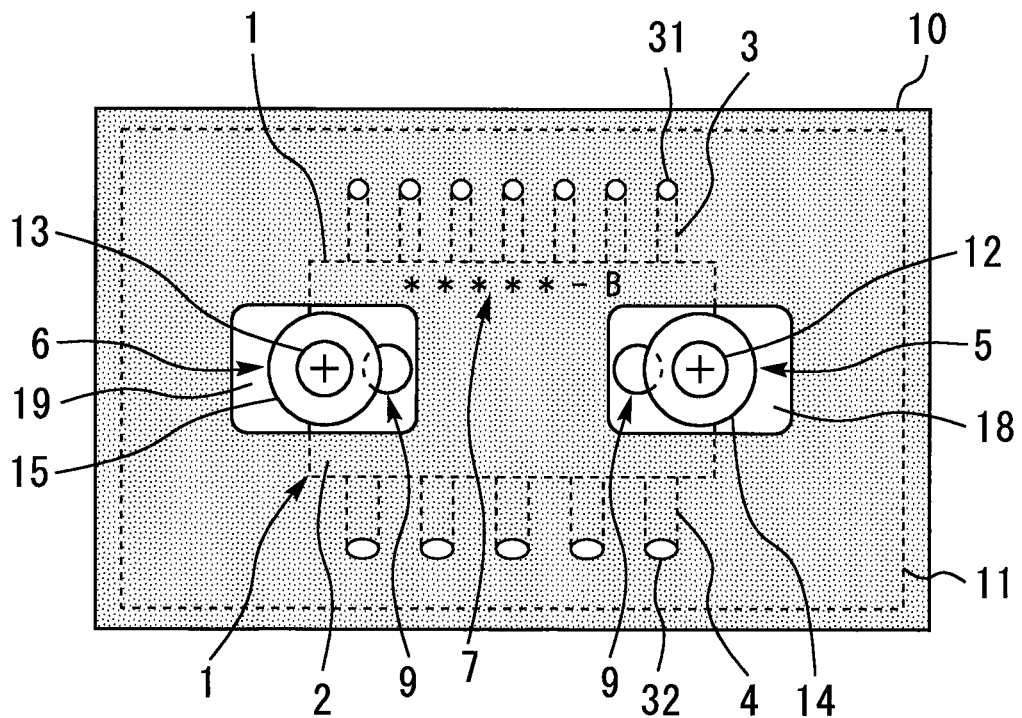
FIG. 6 is a top view illustrating a semiconductor device according to a third embodiment.

FIG. 6 is a top view illustrating a semiconductor device according to a third embodiment. The type 9 is printed on each of both the fitting portions 5 and 6, and exposed from at least one of the openings 18 and 19. Since the type 9 can be visually recognized through only one of the openings 18 and 19, the identification of the product is enhanced as compared with the second embodiment.

Fourth Embodiment

Figure 7:
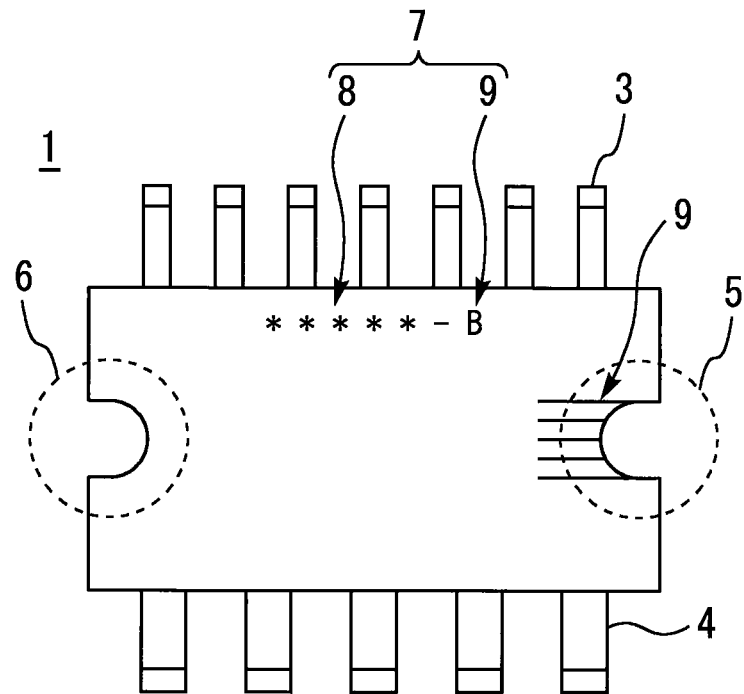
FIG. 7 is a top view illustrating a semiconductor module according to a fourth embodiment.
Figure 8:
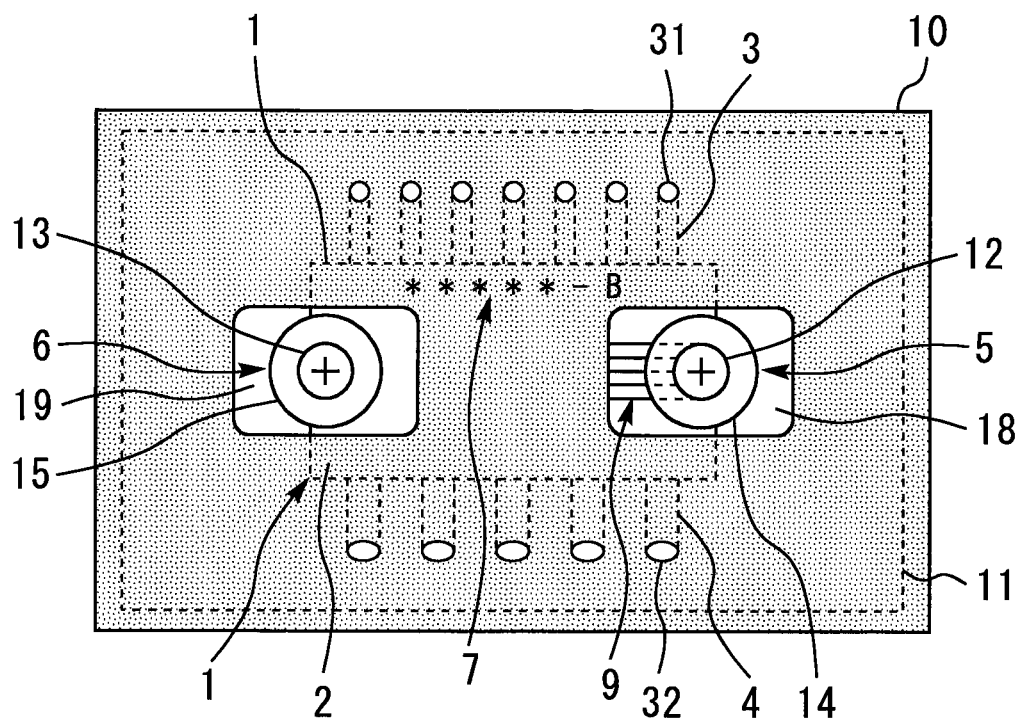
FIG. 8 is a top view illustrating a semiconductor device according to the fourth embodiment.

FIG. 7 is a top view illustrating a semiconductor module according to a fourth embodiment. FIG. 8 is a top view illustrating a semiconductor device according to the fourth embodiment. The type 9 is a set of horizontal lines in which a plurality of lines extending along a longitudinal direction of a module main body 2 are arranged in parallel to one another, and is printed along the arc of the notch of the fitting portion 5. The number of the horizontal lines is set according to a product specification, for example, a current rating. For example, one line is set as 1A rating, and two lines are set as 5A rating. Even when only a part of the type 9 is visually recognizable because the type 9 is hidden by the washer 14, the number of horizontal lines is more easily recognizable than the shape of a character or the like.

Fifth Embodiment

Figure 9:
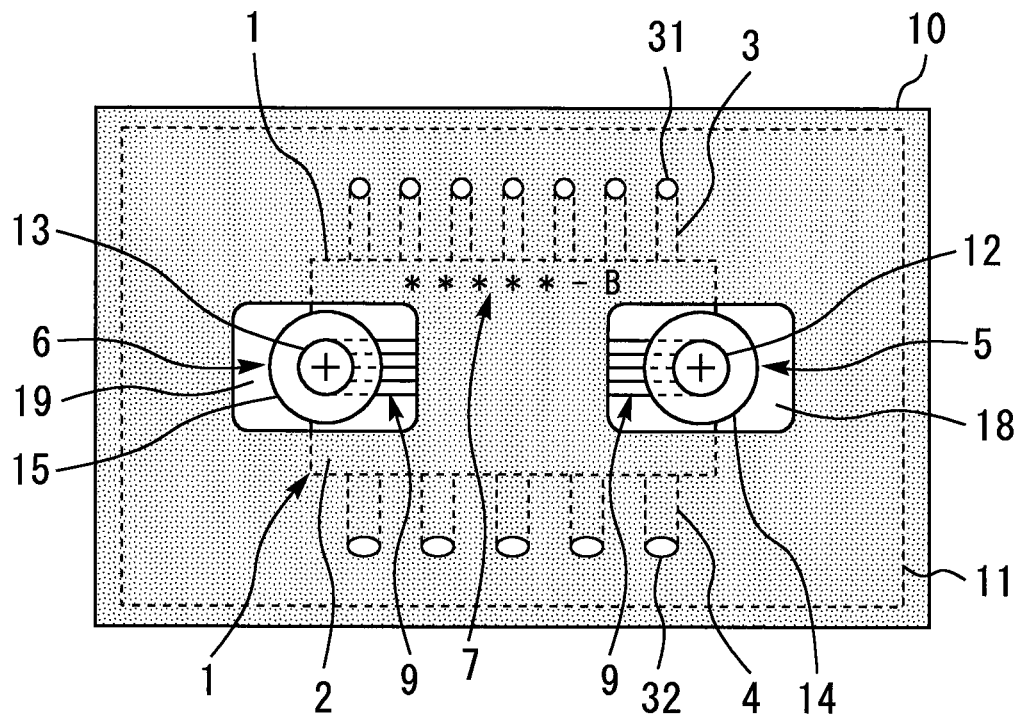
FIG. 9 is a top view illustrating a semiconductor device according to a fifth embodiment.

FIG. 9 is a top view illustrating a semiconductor device according to a fifth embodiment. The type 9 is a set of horizontal lines, and is printed on both of the fitting portions 5 and 6. A part of the type 9 is exposed from at least one of the openings 18 and 19. Since the type 9 can be visually recognized through only one of the openings 18 and 19, the product identification is enhanced as compared with the fourth embodiment.

Sixth Embodiment

Figure 10:
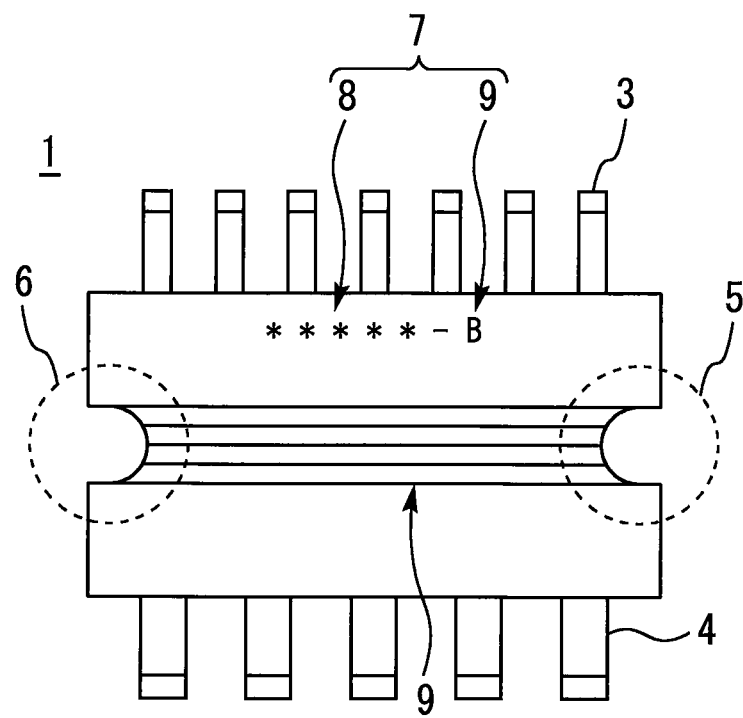
FIG. 10 is a top view illustrating a semiconductor module according to a sixth embodiment.
Figure 11:
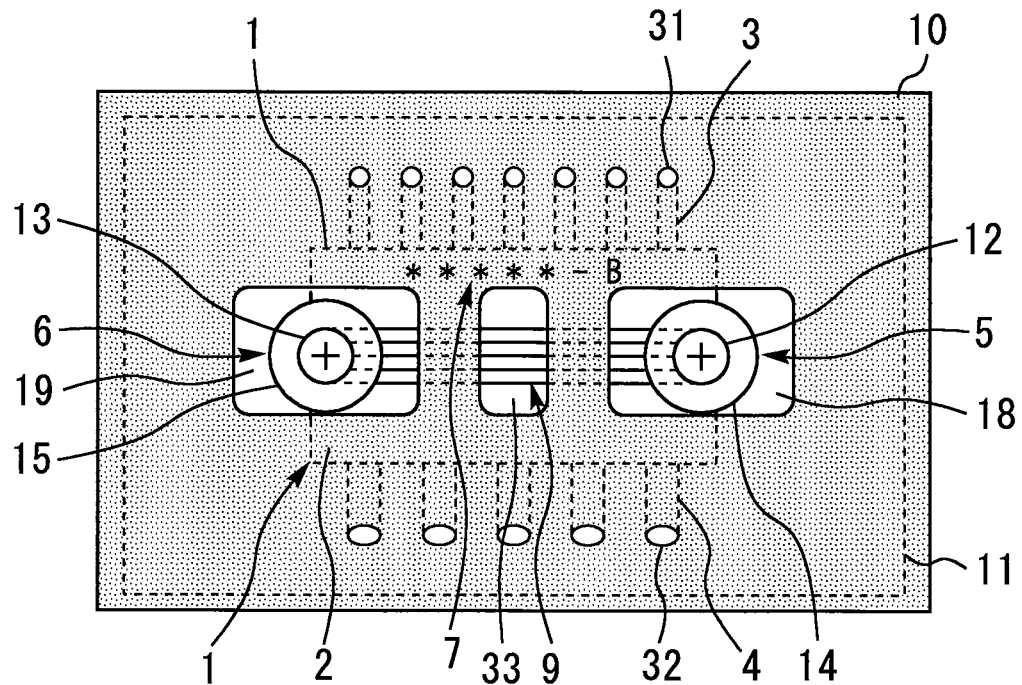
FIG. 11 is a top view illustrating a semiconductor device according to the sixth embodiment.

FIG. 10 is a top view illustrating a semiconductor module according to a sixth embodiment. FIG. 11 is a top view illustrating a semiconductor device according to the sixth embodiment. The horizontal lines of the types 9 printed on both the fitting portions 5 and 6 extend so as to be connected to each other. The mounting board 10 is provided with an opening 33 at a portion other than the portions corresponding to the fitting portions 5 and 6. The horizontal lines of the types 9 extend to the opening 33 and are exposed from the opening 33. Accordingly, since the type 9 can be visually recognized from the opening other than the screw-fastening openings 18 and 19, the product identification is enhanced as compared with the fifth embodiment. In addition, since the opening 33 can be provided at any position above the horizontal lines, the degree of freedom in design of the wiring pattern of the mounting board 10 is enhanced.

Seventh Embodiment

Figure 12:
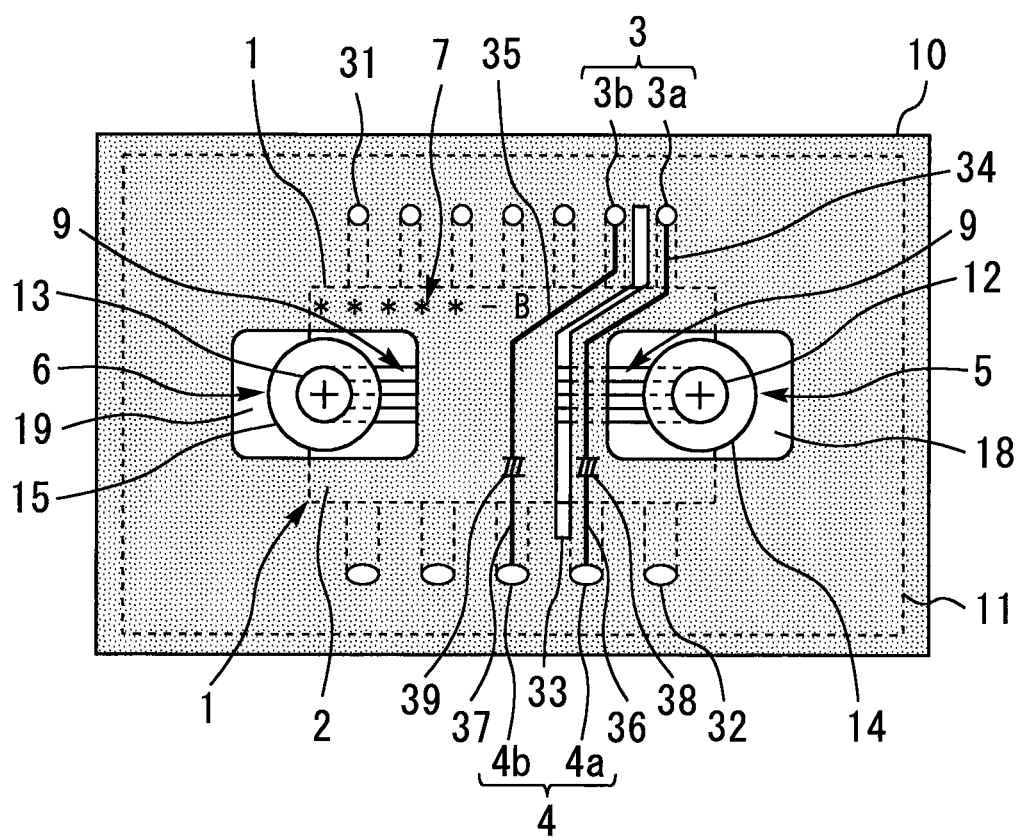
FIG. 12 is a top view illustrating a semiconductor device according to a seventh embodiment.
Figure 13:
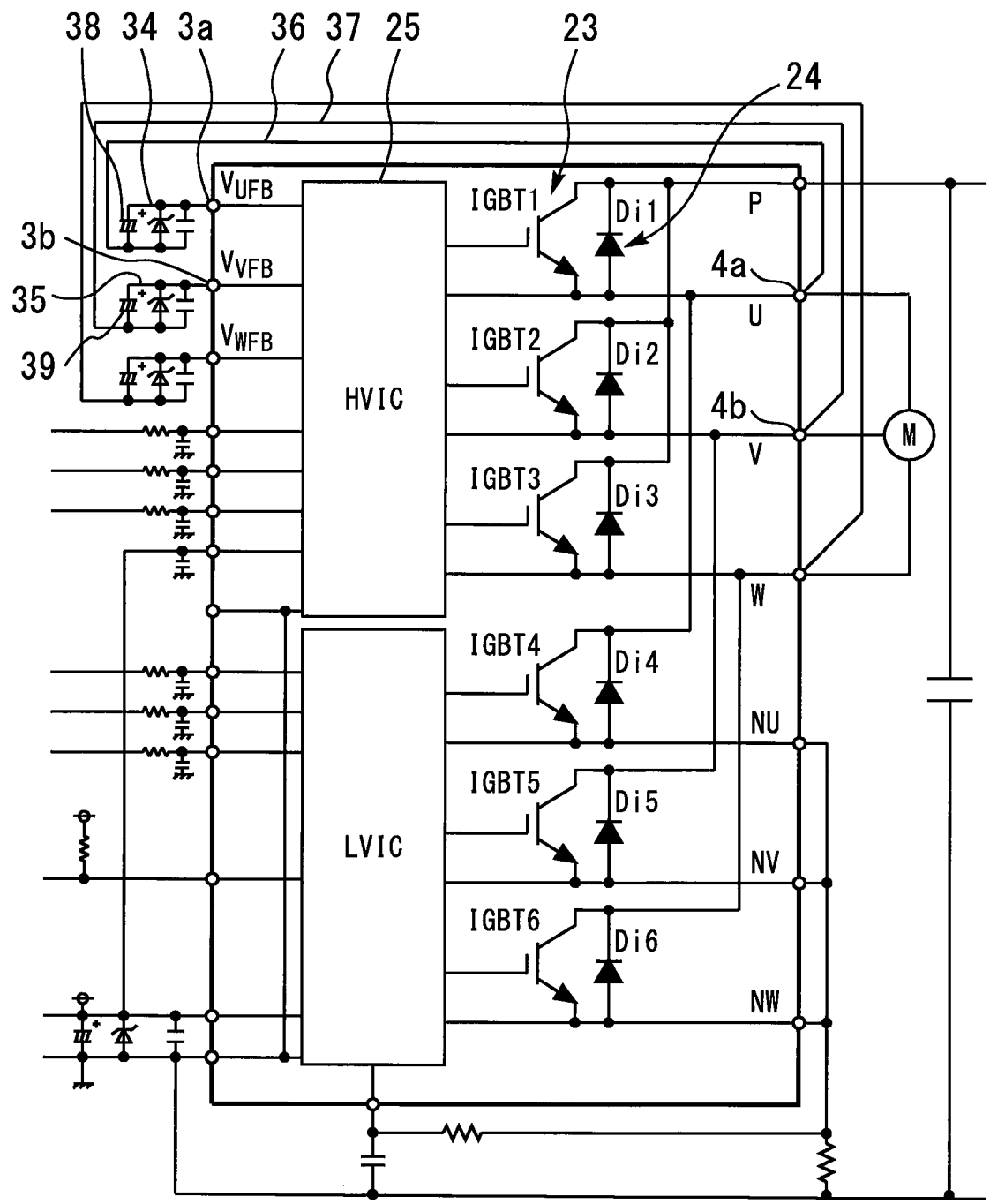
FIG. 13 is a circuit diagram of the semiconductor device according to the seventh embodiment.

FIG. 12 is a top view illustrating a semiconductor device according to a seventh embodiment. FIG. 13 is a circuit diagram of the semiconductor device according to the seventh embodiment. The terminal 3 includes a $V_{UFB}$ terminal 3a and a $V_{VFB}$ terminal 3b which are different in potential from each other. The terminal 4 includes a U terminal 4a and a V terminal 4b which are different in potential from each other. A $V_{UFB}$ wiring 34, a $V_{VFB}$ wiring 35, a U wiring 36, and a V wiring 37 are provided to the mounting board 10, and are connected to the $V_{UFB}$ terminal 3a, the $V_{VFB}$ terminal 3b, the U terminal 4a, and the V terminal 4b, respectively. A capacitor 38 is connected between the $V_{UFB}$ wiring 34 and the U wiring 36. A capacitor 39 is connected between the $V_{VFB}$ wiring 35 and the V wiring 37. The opening 33 is provided in the mounting board 10 between the adjacent $V_{UFB}$ wiring 34 and $V_{VFB}$ wiring 35 and between the U wiring 36 and the V wiring 37. The opening 33 separates wirings having high voltages and different potentials from each other to ensure a creeping distance. The horizontal lines of the type 9 extend to the opening 33 and are exposed from the opening 33. As a result, the type 9 can be visually recognized from the opening other than the screw-fastening openings 18 and 19, so that the product identification is enhanced as compared with the fifth embodiment.

Eighth Embodiment

Figure 14:
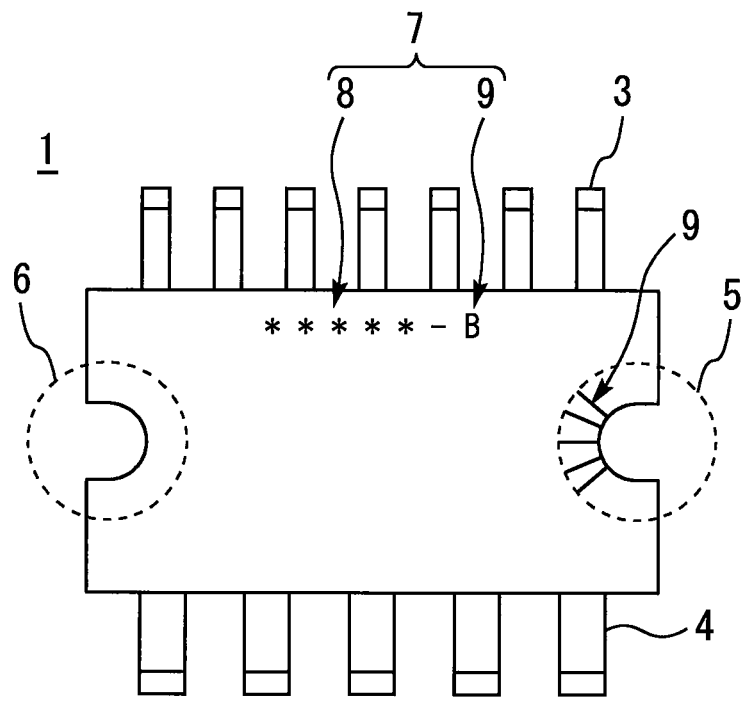
FIG. 14 is a top view illustrating a semiconductor module according to an eighth embodiment.
Figure 15:
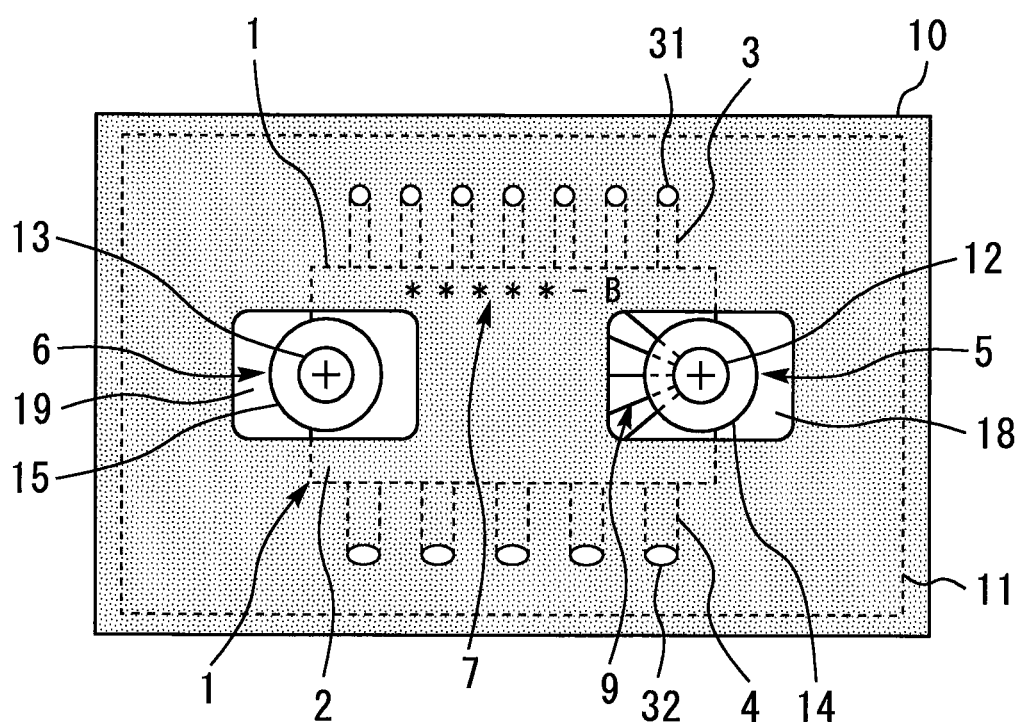
FIG. 15 is a top view illustrating a semiconductor device according to the eighth embodiment.

FIG. 14 is a top view illustrating a semiconductor module according to an eighth embodiment. FIG. 15 is a top view illustrating a semiconductor device according to the eighth embodiment. The type 9 is a set of radial lines in which a plurality of lines spread radially, and is printed along the arc of the notch of the fitting portion 5. The number of radial lines is set according to a product specification, for example, a current rating. For example, one line is set as 1A rating, and two lines are set as 5A rating. Even when only a part of the type 9 is visually recognizable because the type 9 is hidden by the washer 14, the number of the radial lines is more easily recognizable than the shape of a character or the like. In the case of the horizontal lines, the distance between the lines is reduced as the module is miniaturized or the number of the lines is increased, and thus recognizability is deteriorated. On the other hand, since the radial lines spread radially around the notch of the fitting portion 5, the distance between the lines increases at the ends of the radial lines, thereby enhancing the recognizability.

Ninth Embodiment

Figure 16:
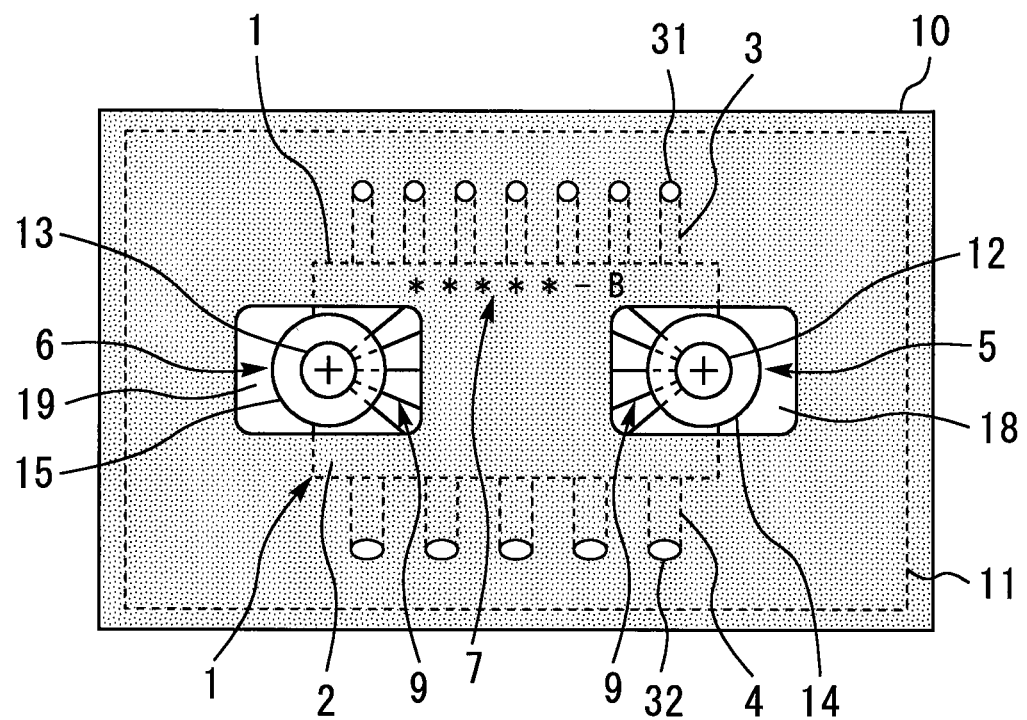
FIG. 16 is a top view illustrating a semiconductor device according to a ninth embodiment.

FIG. 16 is a top view illustrating a semiconductor device according to a ninth embodiment. The type 9 is a set of radial lines, and printed on each of both the fitting portions 5 and 6. A part of the type 9 is exposed from at least one of the openings 18 and 19. Since the type 9 can be visually recognized through only one of the openings 18 and 19, the product identification is enhanced as compared with the eighth embodiment.

The semiconductor chips 23 and 24 are not limited to chips formed of silicon, but instead may be formed of a wide-bandgap semiconductor having a bandgap wider than that of silicon. The wide-bandgap semiconductor is, for example, a silicon carbide, a gallium-nitride-based material, or diamond. A semiconductor chip formed of such a wide-bandgap semiconductor has a high voltage resistance and a high allowable current density, and thus can be miniaturized. The use of such a miniaturized semiconductor chip enables the miniaturization and high integration of the semiconductor device in which the semiconductor chip is incorporated. Further, since the semiconductor chip has a high heat resistance, a radiation fin of a heatsink can be miniaturized and a water-cooled part can be air-cooled, which leads to further miniaturization of the semiconductor device. Further, since the semiconductor chip has a low power loss and a high efficiency, a highly efficient semiconductor device can be achieved. Both the semiconductor chips 23 and 24 are desirably formed of a wide-bandgap semiconductor. However, only one of the semiconductor chips 23 and 24 may be formed of a wide-bandgap semiconductor. Also in this case, the advantageous effects described in this embodiment can be obtained.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2019-120457, filed on Jun. 27, 2019 including specification, claims, drawings and summary, on which the Convention priority of the present application is based, is incorporated herein by reference in its entirety.

The invention claimed is:

1. A semiconductor device comprising:
    a semiconductor module including a module main body having first and second main surfaces which are opposite to each other, and a terminal protruding from a side surface of the module main body and bent toward the first main surface side;
    a mounting board placed on the first main surface side and connected to the terminal;
    a heat radiation fin placed on the second main surface side; and
    a screw fitting a fitting portion of the module main body from the first main surface side to the heat radiation fin,
    wherein the mounting board is provided with an opening at a portion facing the fitting portion, and
    a type of a product is printed on the first main surface and exposed from the opening of the mounting board.

2. The semiconductor device according to claim 1, wherein the screw fits the semiconductor module via a washer, and
    at least part of the type is printed outside the washer.

3. The semiconductor device according to claim 1, wherein the fitting portion includes first and second fitting portions,
    the opening includes first and second openings provided at portions corresponding to the first and second fitting portions respectively, and
    the type is printed on each of both the first and second fitting portions and exposed from at least one of the first and second openings.

4. The semiconductor device according to claim 2, wherein the fitting portion includes first and second fitting portions, the opening includes first and second openings provided at portions corresponding to the first and second fitting portions respectively, and the type is printed on each of both the first and second fitting portions and exposed from at least one of the first and second openings.

5. The semiconductor device according to claim 1, wherein the type is horizontal lines, and a number of the horizontal lines is set according to a product specification.

6. The semiconductor device according to claim 5, wherein a third opening is provided at a portion of the mounting board other than a portion corresponding to the fitting portion, and the horizontal line extends to the third opening and is exposed from the third opening.

7. The semiconductor device according to claim 6, wherein the terminal includes first and second terminals which are different in potential from each other, the mounting board includes first and second wirings connected to the first and second terminals respectively, and the third opening is provided between the first wiring and the second wiring.

8. The semiconductor device according to claim 2, wherein the type is horizontal lines, and a number of the horizontal lines is set according to a product specification.

9. The semiconductor device according to claim 8, wherein a third opening is provided at a portion of the mounting board other than a portion corresponding to the fitting portion, and the horizontal line extends to the third opening and is exposed from the third opening.

10. The semiconductor device according to claim 9, wherein the terminal includes first and second terminals which are different in potential from each other, the mounting board includes first and second wirings connected to the first and second terminals respectively, and the third opening is provided between the first wiring and the second wiring.

11. The semiconductor device according to claim 3, wherein the type is horizontal lines, and a number of the horizontal lines is set according to a product specification.

12. The semiconductor device according to claim 11, wherein a third opening is provided at a portion of the mounting board other than a portion corresponding to the fitting portion, and the horizontal line extends to the third opening and is exposed from the third opening.

13. The semiconductor device according to claim 12, wherein the terminal includes first and second terminals which are different in potential from each other, the mounting board includes first and second wirings connected to the first and second terminals respectively, and the third opening is provided between the first wiring and the second wiring.

14. The semiconductor device according to claim 1, wherein the type is radial lines, and a number of the radial lines is set according to a product specification.

15. The semiconductor device according to claim 2, wherein the type is radial lines, and a number of the radial lines is set according to a product specification.

16. The semiconductor device according to claim 3, wherein the type is radial lines, and a number of the radial lines is set according to a product specification.

17. The semiconductor device according to claim 1, wherein the semiconductor module includes a semiconductor chip formed of a wide-bandgap semiconductor.

18. The semiconductor device according to claim 2, wherein the semiconductor module includes a semiconductor chip formed of a wide-bandgap semiconductor.

19. The semiconductor device according to claim 3, wherein the semiconductor module includes a semiconductor chip formed of a wide-bandgap semiconductor.

20. The semiconductor device according to claim 4, wherein the semiconductor module includes a semiconductor chip formed of a wide-bandgap semiconductor.

* * * * *